United States Patent

[11] 3,566,064

[72] Inventor Stewart Neillis
Colts Neck, N.J.
[21] Appl. No. 835,912
[22] Filed June 19, 1969
[45] Patented Feb. 23, 1971
[73] Assignee Technical Wire Products, Inc.
Cranford, N.J.
Continuation of application Ser. No.
457,272, May 20, 1965, now abandoned.

[54] RADIATION SHIELD
13 Claims, 4 Drawing Figs.

[52] U.S. Cl. .......... 200/168
[51] Int. Cl. .......... H01h 9/04
[50] Field of Search .......... 200/168 (G1), 168 (G); 174/35.1, 35.4, 35.5

[56] References Cited
UNITED STATES PATENTS
2,795,144 6/1957 Morse .......... 200/168(G)X

*Primary Examiner*—H. O. Jones
*Attorney*—Littlepage, Quaintance, Wray and Aisenberg

ABSTRACT: A switch is provided which is shielded against the passage of electromagnetic energy and is composed of a switch case, a switch lever in the switch case and a flexible electromagnetic radiation shielding boot attached to said case and encasing and shielding the switch lever to prevent escape of electromagnetic radiation through said switch. The boot has a resilient electrically insulating outside jacket and an electrically conductive wire mesh inside lining fitting within the jacket and over the lever.

PATENTED FEB 23 1971

3,566,064

INVENTOR
Stewart Nellis

BY Littlepage, Quaintance & ... [signature]

ATTORNEYS

RADIATION SHIELD

This application is a continuation of Ser. No. 457,272, filed May 20, 1965 and now abandoned.

This invention relates to electromagnetic radiation shielded switches used with electronic equipment. More particularly, this invention relates to an improved shielded switch which will efficiently prevent radiation of electromagnetic interference through openings in the switch and an improved electrical insulator, fluid seal, and electromagnetic radiation shield for switches.

The effective operation of any electrical or electronic equipment requires shielding it against electric or electromagnetic radiation either entering it or escaping from it. For example, the equipment carried in today's manned and unmanned, airborne vehicles, such as radar and communication, navigation and flight control systems, operate over a broad region of the electromagnetic spectrum. With the close proximity of various types of equipment, it is essential that one system be prevented from interfering with another system. In such an environment, radio or electromagnetic radiation interference can induce a false signal in a nearby system which could cause the loss of the vehicle and the possible loss of many lives. Military equipment frequently uses high power radio frequency energy which is a common source of interference, and if it occurs near other equipment designed to operate with very low signal strength, the radio interference will make this equipment function improperly or make it inoperative.

Radio interference may be conducted into or out of a piece of electrical equipment by means of the leads which connect the equipment to a power supply, signal source, or another unit of electrical equipment. Electrical filters are normally used to block conducted radio interference. Radio interference may also be radiated into or out of electrical equipment. The general preventive measure for radiated radio interference is to shield the electrical equipment by enclosing it in a container of conductive material.

It is generally impractical to enclose electrical equipment in a conductive container having no openings or seams. Normally, the container or housing of electrical equipment must be provided with openings for access to the interior so that service and maintenance may be performed. Other openings are needed for electrical connections and switches. Merely covering the openings with lids or doors may not insure adequate shielding because such covering results in a number of seams between themselves and the container or housing. As result, these seams may present openings for the flow of electromagnetic wave quanta into and out of the housing. Thus, normal manufacturing techniques, weight considerations, and structural deflections make it inevitable that openings will be present. Such openings allow excessive passage of radiated radio interference.

The particular components of electronic equipment that have proved most difficult to shield against electromagnetic radiation are the movable switches which control the selective operation of many electronic devices. The switch must have a movable actuating member and bushing openings, and it must be accessible for manual control.

The instant invention provides an improved toggle switch that is accessible and effectively shielded against the passage of electromagnetic radiation and an insulating boot for the actuating switch member. The switch of the instant invention has properties superior to those previously used; it is a simple, rugged, lightweight switch that is electrically grounded, and has an electromagnetic radiation shield that is efficient, reliable and economically manufactured on a commercial scale.

Other aspects, objects and advantages of the present invention will become apparent from the detailed discussion thereof as set forth below and the drawings which show a preferred embodiment of the invention and the essential features of the invention will be set forth in the appended claims.

Figure 1:
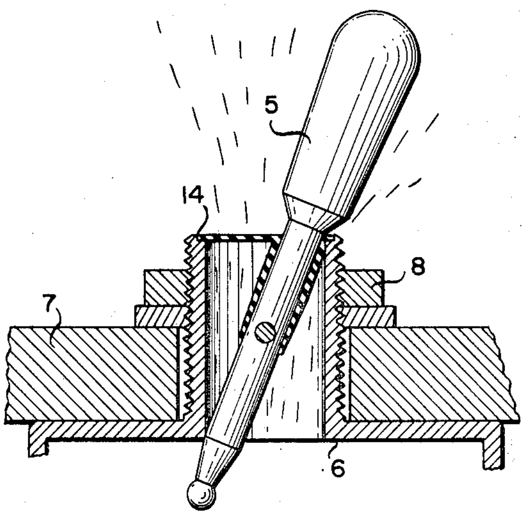
FIG. 1 is a sectional view of a toggle switch of the prior art.

Referring to the drawings, FIG. 1 shows a typical toggle switch 4, which has a movable switch actuating member or lever 5 that can be moved to either the on or the off position, switch case 6, electromagnetic panel shields 7, and retaining nut 8. The dotted lines represent electromagnetic radiation escaping through the bushing openings of the toggle switch 4.

Figure 2:
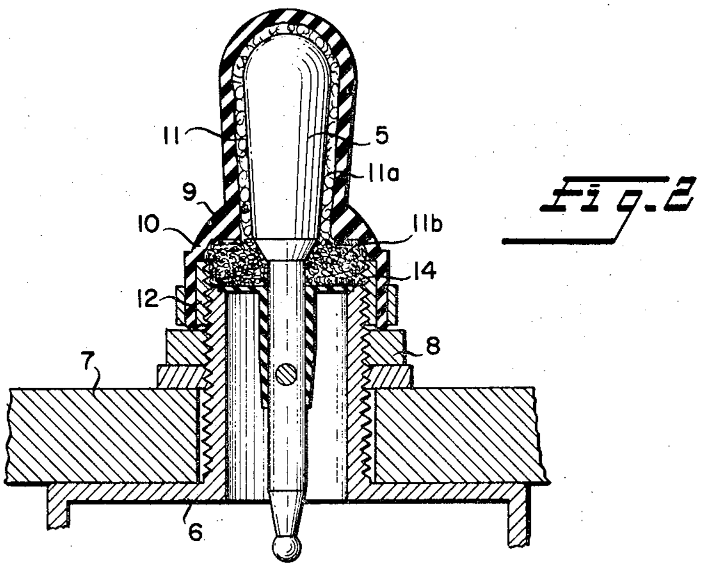
FIG. 2 is a sectional view of the toggle switch with the switch actuating member and insulating boot of this invention.

FIG. 2 shows the electromagnetic radiation shielded toggle switch of this invention which uses a flexible, resilient, insulating boot 9 to keep electromagnetic radiation from entering or escaping. Boot 9 is basically a flexible, resilient, electrically insulating jacket which covers switch lever 5. Boot 9 has an insulating and moisture inhibiting outer layer 10, which contains a flexible wire mesh liner 11 fitted therein. The wire liner 11 makes excellent electrical contact with lever 5, and the upstanding threaded section 14 of switch case 6 and therethrough with panel 7. In this way, wire liner 11 absorbs and effectively prevents electromagnetic radiation from leaking through the bushing openings of the toggle switch. Also, the excellent contact with switch lever 5 prevents it from serving as an "antenna".

Figure 3:
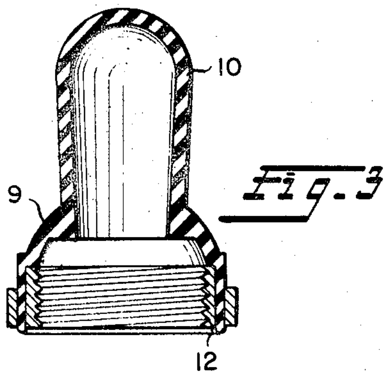
FIG. 3 is a sectional view of the resilient portion of the insulating boot.
Figure 4:
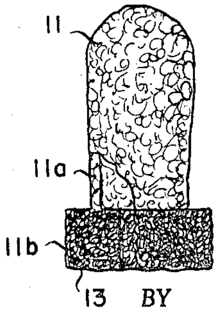
FIG. 4 is a perspective view of the knit wire portion of the boot.

FIG. 3 shows a preferred resilient moisture seal and insulating jacket 10 which has a partially embedded retaining nut 12. The inner portion of nut 12 should make electrical contact with the upstanding threaded section 14. A portion of jacket 10 extends beyond nut 12 to serve as a moisture seal. FIG 4 shows a knitted wire liner 11 having a relatively thin woven crown portion 11*a* and a densified, thicker integral annular ring portion 11*b* which has a greater diameter designed to facilitate fitting tightly into jacket 10 and tightly over lever 5 to make a secure electrical seat 13 on top of upstanding threaded section 14 and with the exposed metal portion of nut 12 which is not seated on upstanding portion 14. Thus the wire mesh effectively absorbs all stray electromagnetic radiation.

From an economical and functional point of view, it is cheaper and better to produce and supply the outer jacket 10 of the boot and the knit wire liner 11 separately. Although the outer layer of the wire can be partially embedded in the jacket material, or bound to it with a suitable adhesive, this is undesirable because it tends to reduce the flexibility of the boot unit. In practice a separate jacket 10 and liner 11 fit together so tightly that for all practical purposes they form a unified boot which is very durable, flexible and reliable.

The outer insulating layer 10 can be any desired resilient, electrically insulating material. The preferred insulating materials are neoprene, silicone rubbers and equivalent materials which are able to function over wide temperature ranges, seal out moisture, and are resistant to chemical oxidative and other types of deterioration.

Insulating layer 10 and knit wire liner 11 are specifically designed to fit a specific toggle switch; since most toggle switches are produced in standard sizes, the jacket 10 and the knit wire liner 11 can also be produced in standard sizes.

The boot retaining means, which attaches boot 9 to switch case 6, is preferably partially embedded in the insulating layer 10 and it preferably makes electrical contact with upstanding portion 14; one example of a suitable retaining means is retaining nut 12 showing in the drawings. Other examples of boot retaining means which can be used include separate or partially embedded retaining clamps, rivets, etc. Adhesives may be used, but they will not help to electromagnetically shield the switch. The specific boot retaining means not in contact with upstanding portion 14 should be electrically insulated either with an insulating coating or with some other effective insulating means. The use of a retaining nut, such as retaining nut 12, has the advantage of easy removal and replacement and ease of positioning the boot 9 in place over the threads of upstanding portion 14.

A variety of knitted and woven wire mesh materials are commercially available that have sufficiently small openings to form an efficient electrical shield and due to the elasticity of the specifically shaped knitted wire or even woven wire, used in this invention, they readily stretch to fit over the wide portion of the toggle switch lever to provide a contour fit. Any metal cloth that has acceptable shielding properties may be used to form the knitted wire liner used in this invention.

To test the boot shields of this invention, silicone rubber boots containing snugly fitting, flexible knitted mesh liners were placed over existing standard toggle switches. This required no modification of the switch or its mounting means. The boot was simply slipped over the switch lever and the threaded nut tightened around the upstanding threaded portion of the switch case. The elasticity of the knitted liner firmly seated the knitted liner on top of the threaded collar, and these toggle switch boot shields adequately met military design standards and had an operational life in excess of 30,000 actuations.

The toggle switch shields of this invention completely shield the bush openings against the passage of electromagnetic radiation and also effectively seal the toggle switch against moisture and dust, without interfering with the manual on-off operation of the toggle switch. Another advantage of the boot shields of this invention, as previously indicated, is that the wire mesh lining effectively grounded the toggle switch lever and prevented the lever from acting as a radiating antenna.

After reading the foregoing detailed description, it should be apparent that variations may be made in the illustrative details of this invention without departing from the spirit of the invention or the scope thereof as defined in the appended claims.

I claim:

1. In an electronic device, an electromagnetic radiation shielded toggle switch having a switch case, a switch lever in said switch case, and a flexible, electromagnetic radiation shielding boot attached to said switch case which covers and shields said lever from electromagnetic radiation, said boot having a resilient, electrically insulating outer layer and a conductive wire mesh inside liner.

2. The toggle switch of claim 1, wherein said insulating outer layer is a silicone rubber.

3. The toggle switch of claim 1, wherein said insulating outer layer is neoprene.

4. The toggle switch of claim 1, wherein said wire mesh liner is a knitted wire mesh.

5. An electromagnetic radiation shield boot for toggle switches having a resilient, electrically insulating outer layer and a wire mesh inner liner.

6. The boot of claim 5, wherein said resilient outer layer is a silicone rubber.

7. The boot of claim 5, wherein said resilient outer layer is neoprene.

8. The boot of claim 5, wherein said wire mesh inner liner is a knitted wire mesh.

9. An integral electromagnetic energy radiation boot shield for toggle switches having a conductive wire mesh inside liner comprising a crown and a compacted integral annular rim having a greater outside diameter than the outside diameter of the crown and a greater thickness than the crown.

10. In an electronic device, an electromagnetic shielded toggle switch having a switch case, a switch lever in said switch case, and a flexible, electromagnetic radiation shielding boot attached to said switch case which covers and shields said lever from electromagnetic radiation, said boot having a resilient electrically insulating outside jacket, an electrically conductive knitted wire mesh inside lining fitting tightly within said jacket and tightly over said lever.

11. In an electronic device, a shielded switch having a switch case, a movable switch actuating member in said switch case, a flexible shield covering and shielding said switch actuating member and including a layer of electrically conductive material in contact with said case to prevent passage of radiation through said case, said shield flexing with movement of said actuating member to allow operation of said switch.

12. A switch as claimed in claim 11, in which said layer of electrically conductive material is in contact with said switch actuating member so as to prevent radiation from said member.

13. A switch as claimed in claim 11, in which said layer of electrically conductive material is covered with a resilient, electrically insulating material.